United States Patent [19]

Hessel

[11] Patent Number: 5,369,606
[45] Date of Patent: Nov. 29, 1994

[54] REDUCED STATE FIR FILTER
[75] Inventor: Clifford Hessel, Rochester, N.Y.
[73] Assignee: Harris Corporation, Melbourne, Fla.
[21] Appl. No.: 944,247
[22] Filed: Sep. 14, 1992
[51] Int. Cl.⁵ ............................................. G06F 15/31
[52] U.S. Cl. .............................. 364/724.16; 364/724.1
[58] Field of Search ...................... 364/724.16, 724.01, 364/724.10, 724.13

[56] References Cited

U.S. PATENT DOCUMENTS

| | | | |
|---|---|---|---|
| 4,450,533 | 5/1984 | Petit et al. | 364/724 |
| 4,691,293 | 9/1987 | Conboy | 364/724 |
| 4,953,184 | 8/1990 | Simone | 364/724.10 |
| 5,210,705 | 5/1993 | Chauvel et al. | 364/724.16 |

OTHER PUBLICATIONS

J. R. Bennett et al. "On the Characteristics of a Simple Architecture for Finite Impulse Digital Filter", IEEE Transactions on Computers, vol. C-27, No. 12, Dec. 1978, pp. 1197-1202.

*Primary Examiner*—David H. Malzahn
*Attorney, Agent, or Firm*—Rogers & Killeen

[57] ABSTRACT

A method and apparatus for increasing the throughput of a finite impulse response (FIR) digital filter with particular applicability to systems in which the input signal sample values are constrained relative to the output signal. The method and apparatus include relatively constrained input data and positional information for identifying the location of the precomputed values of the state of the filter. A lookup table stores all the states of the filter (i.e., the sums of the products of signal sample values times filter weighting coefficients).

13 Claims, 4 Drawing Sheets

| FOR $S_{OUT}$ COMPUTED AT $\Delta t$: | (PRIOR ART) $S_O$ (COMP. AT $\Delta t$) | $S_O$ (COMP. AT $4\Delta t$) |
|---|---|---|
| 0 | $D_9$ | $D_3$ |
| $\Delta t$ | $D_8$ | $D_2$ |
| $2\Delta t$ | $D_7$ | $D_2$ |
| $3\Delta t$ | $D_6$ | $D_2$ |
| $4\Delta t$ | $D_5$ | $D_2$ |
| $5\Delta t$ | $D_4$ | $D_1$ |
| $6\Delta t$ | $D_3$ | $D_1$ |
| $7\Delta t$ | $D_2$ | $D_1$ |
| $8\Delta t$ | $D_1$ | $D_1$ |

$\left.\begin{array}{c}D_8\\D_7\\D_6\\D_5\end{array}\right\} D_2$ $\left.\begin{array}{c}D_4\\D_3\\D_2\\D_1\end{array}\right\} D_1$

FIG. 3

REDUCED STATE FIR FILTER

BACKGROUND OF THE INVENTION

The present invention relates to processing of digital and analog signals, and more particularly to the computational techniques used in Finite Impulse Response ("FIR") digital filters.

The uses and advantages of FIR filters are well known. In operation and with reference to FIGS. 1 and 2, an FIR digital filter receives an input signal $S_{IN}$ that may be in analog or digital format, filters the input signal, and provides a state-of-the-filter output signal $S_{OUT}$ that is responsive to the filter characteristics. Typically, FIR digital filters sum the products of plural discrete signal values ($S_0, S_{-1}, S_{-2}, \ldots, S_{-M}$), where M is the number of filter taps, times weighting coefficients ($A_0, A_1, A_2, \ldots, A_M$) using the following formula:

$$S_{OUT} = S_0 A_0 + S_{-1} A_1 + S_{-2} A_2 + \ldots + S_{-M} A_M \quad (1)$$

to produce the state-of-the-filter output signal $S_{OUT}$. Often the signal values ($S_0, S_{-1}, \ldots S_M$) are related to each other in time, i.e., $S_0$ is the state of the input signal at $T=0$, $S_{-1}$ the signal at a previous time ($T_{-1}$), $S_{-2}$ is the signal at a second previous time ($T_{-2}$), etc.

As can be appreciated from Equation (1), in a FIR filter with M taps, at least M multiplication operations (and additions), typically conducted sequentially, are required each time the output signal is updated. Because multiplication is a relatively time-consuming process in digital circuitry, the process of multiple, sequential multiplications often limits the effectiveness of FIR filters, especially in wideband data applications.

With further reference to FIG. 2, a typical FIR digital filter may be seen. In the filter, an input signal $S_{IN}$ is periodically sampled and converted from analog to digital in a converter 10 to produce a discrete signal $S_0$. The signal $S_0$ is fed to delay elements 12 where it is to be used with subsequent discrete signals $S_0$, and to a multiplier 14 where it is multiplied by a coefficient $A_0$. The various signals $S_0 \ldots S_{-M}$ are multiplied by their respective coefficients $A_0 \ldots A_M$ and these products are summed in adder 16. The summed digital signal is fed to a digital to analog converter 18 to produce an output signal $S_{OUT}$. The coefficients $A_0$ through $A_M$ are chosen using techniques known in the art to produce an appropriate filter response. The filter of FIG. 2 parallels all of the multiplications, so that the time to perform the calculation of $S_{OUT}$ at each output sample time is reduced substantially but at a substantial increase in complexity (and usually, cost) of the filter which now requires M multipliers and an adder which can access each multiplier. Note that the filter of FIG. 2 still requires at least M additions performed sequentially after a multiplication. Obviously, with a further increase in complexity, the M sequential additions could be carried out using more parallel processing to add, in parallel, predetermined sets of the $A_0 S_0 \ldots A_M S_{-M}$ products to produce plural subtotals which can be added sequentially to produce the output of the adder 16.

To reduce the computational time in digital filters, it is known to replace the coefficient multipliers with shift registers. In such systems, as disclosed in U.S. Pat. No. 4,691,233 to Conboy, the input signal is sampled by an analog-to-digital converter which produces a digital signal representing the power of two most closely corresponding to the value of the input signal. The power-of-two digital signal is subsequently used to shift the various co-efficients $A_0 \ldots A_M$ (rather than multiply) to produce the plural products which may be added by the adder. Because digital shifting operations are generally much faster than digital multiplying, the shifting filters are generally faster, albeit with some loss of accuracy and/or responsiveness of the filter. The shifting filter also generally requires that M addition steps be performed after the shifting operations, limiting the effectiveness of such filters in wide bandwidth systems.

As is known, in some applications FIR filter input signals $S_{-M}$ may assume two values: 0 or 1. Thus, each product $S_{-M} A_M$ may take on one of two values: 0 or $A_M$. Where the coefficients $A_0 \ldots A_M$ are fixed in a binary input system, the output signal, $S_{OUT}$, may take any one of $2^M$ values. In some prior art systems, it is known to precompute the $2^M S_{OUT}$ values and to store the values of $2^M S_{OUT}$ in a suitable memory where they may be addressed using the sequence of input data. (See, for example, U.S. Pat. No. 4,953,184 to Simons). For example, in a filter having eight taps at which the signal value may be 0 or 1, all of the possible states of the filter may be stored in 256 ($2^8$) storage locations. However, where the number of filter taps M is large, for example in a 95 tap filter, the number of memory locations required to store all of the $2^M$ values becomes very large (e.g., $3.96 \times 10^{28}$ locations for a 95 tap system) so as to become very expensive, even if possible to implement in hardware.

It is known in digital filters that the output rate of the filter may differ from the input rate. For example, the output rate may exceed the input rate and, accordingly, states of the filter may be generated at a rate faster than the input data are sampled. In such circumstances, the sampled input data may be repeated, i.e., not updated, while the output state of the filter is computed several times. If, for example, the output state of the filter is being computed at a rate which is four times faster than the input data are being sampled, the filter would have four newly-computed output states for each sample of the input. Generally, in such systems, the digital filter uses as its digital input the last sample of the input signal. Thus, in the above example, each digital input (from the input sampling) would be used four consecutive times before a new sample is taken.

The present invention uses the relationship between the rate of the output signal and the rate of the input samples to significantly reduce the amount of memory required for storage of the precomputed coefficients. The difference between the sample rate and the output rate essentially constrains the number of possible states of the filter. For example, if a filter has eight taps and an input which is sampled as frequently as the output state of the filter is computed, a table of $2^8$ words (256) would be needed to store all of the possible states of the filter. If, however, the output states of the filter are determined at a rate twice as fast as the input data is being sampled, each time the input is sampled two identical inputs are effectively obtained. The number of possible states of the filter is reduced because each signal $S_0 \ldots S_N$ is not free to vary but is constrained to be identical to one of its adjacent signals. The number of possible states of the filter is reduced to $(2) \times (2^4) = 32$ words. In general, this relationship between the input and output rates and memory requirements may be expressed in an M tap system as Memory = 2 times $X^M$ where X is the number of permissible signal values (e.g., , X=2 for binary signals). In accordance with one aspect of the present invention, the $S_{OUT}$ values may be addressed by using the input data pattern and a cycling counter or position indicator which reflects the number of times the current input data has been repeated.

Accordingly, it is an object of the present invention to provide a novel method and device for filtering a digital or analog signal in a FIR filter that increases filter throughput so that the filter can operate with a large number of taps.

It is a further object of the present invention to provide a novel FIR digital filter and method in which the states of the filter may be determined from a lookup table.

It is yet a further object of the present invention to provide a novel FIR digital filter in which the states of the filter are stored in a memory and addressed using input data patterns and positional information.

It is still a further object of the present invention to provide a novel device and method for filtering an input signal with an FIR filter that has a memory for storing states of the filter where the memory is addressed with an N bit address signal comprising P bits of a pattern of data from an input signal and N-P bits of pattern position data.

These and many other objects and advantages of the present invention will be readily apparent to one skilled in the art to which the invention pertains from a perusal of the claims and the following detailed description of preferred embodiments when read in conjunction with the appended drawings.

BRIEF DESCRIPTION OF THE DRAWINGS

FIG. 3 is a tabular presentation of the data states through various FIR filters;

DETAILED DESCRIPTION OF PREFERRED EMBODIMENTS

With reference to FIG. 3, the operation of one aspect of the present invention can be illustrated by observing the time sequence of data into the filter. In a conventional filter in which the output state is computed at an interval $\Delta t$ and the input signal is being sampled at the same interval, a new input data point ($D_1$, $D_2$, ... $D_9$) enters the filter computation each time the output state is computed, i.e., at $t=0$, $\Delta t$, ... $8\Delta t$. If the input signal is constrained, such as by being sampled at one-fourth the rate of the computation of the filter state, only three different data points ($D_1$, $D_2$, $D_3$) are obtained during the same $8\Delta t$ interval time. In comparison, the data points $D_5$, $D_6$, $D_7$, $D_8$ in the prior art are reduced to a single data point $D_2$ which is repeated four times.

Figure 1:
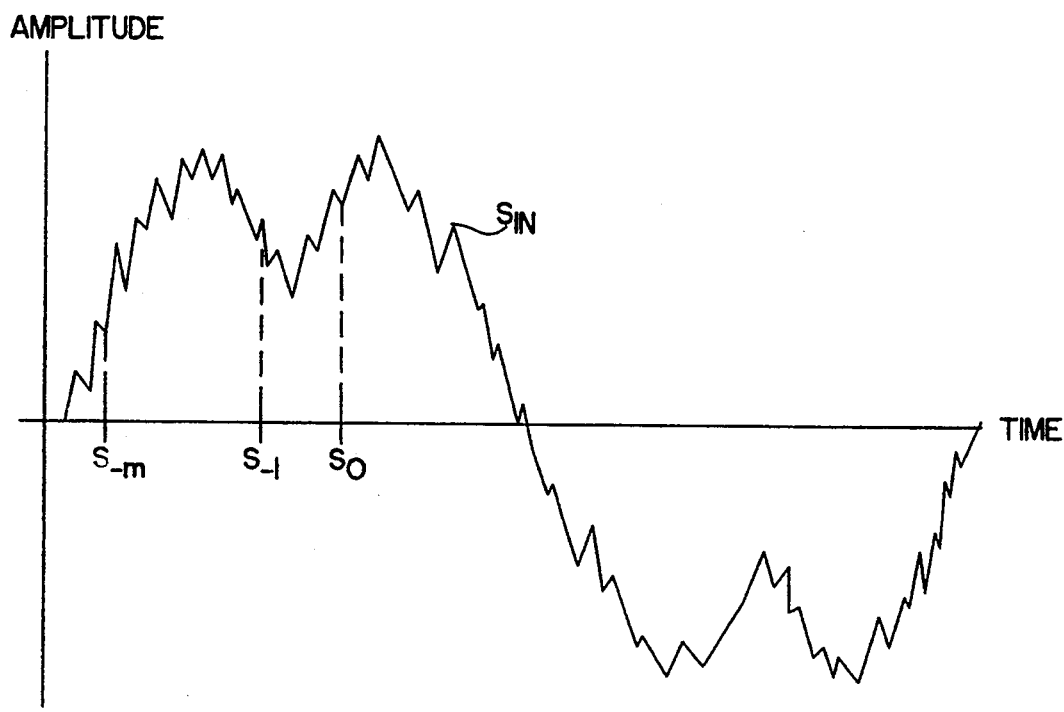
FIG. 1 is a time-amplitude diagram illustrating a signal that may be sampled by the present invention.
Figure 2:
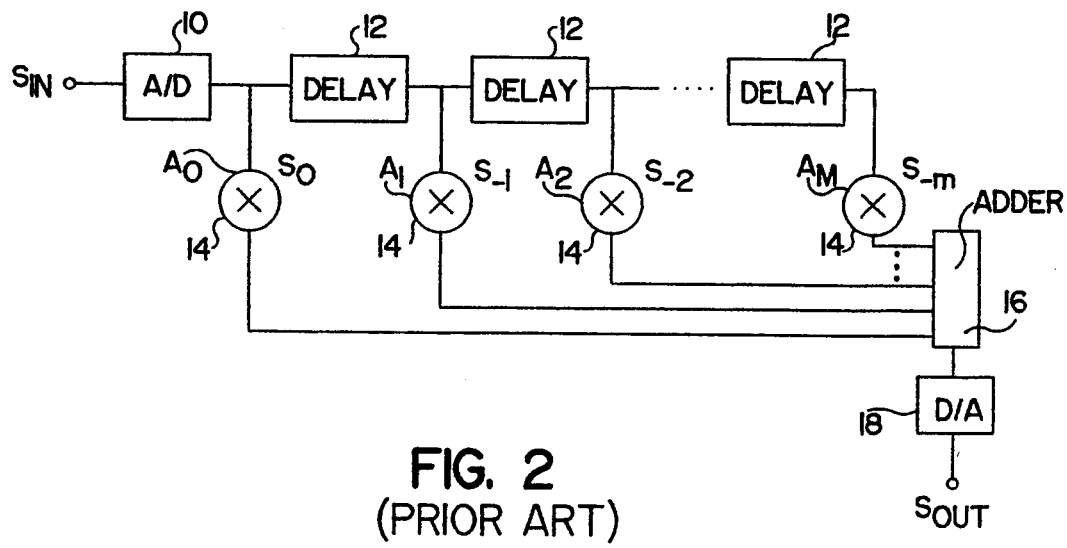
FIG. 2 a block diagram illustrating the components in a typical FIR filter of the prior art.
Figure 4A:
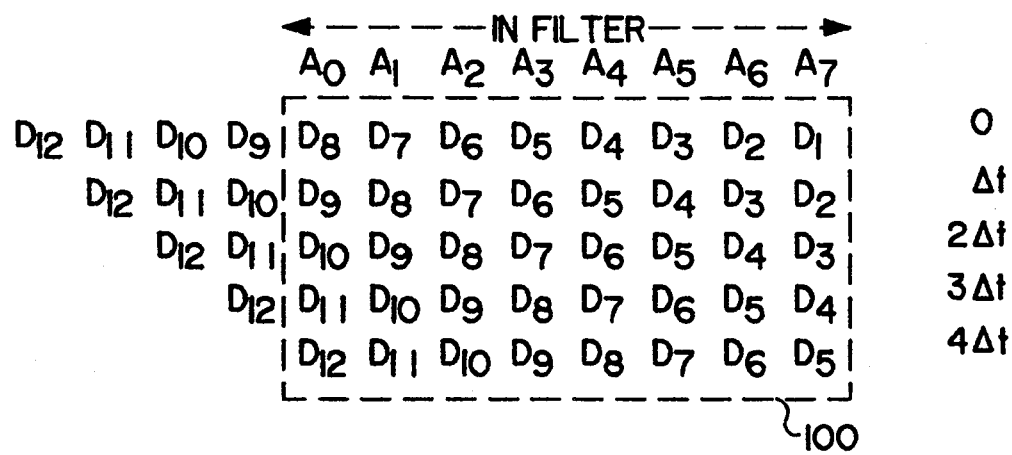
FIGS. 4a and 4b are a time-sequence representations of data passing through FIR filters.
Figure 4B:
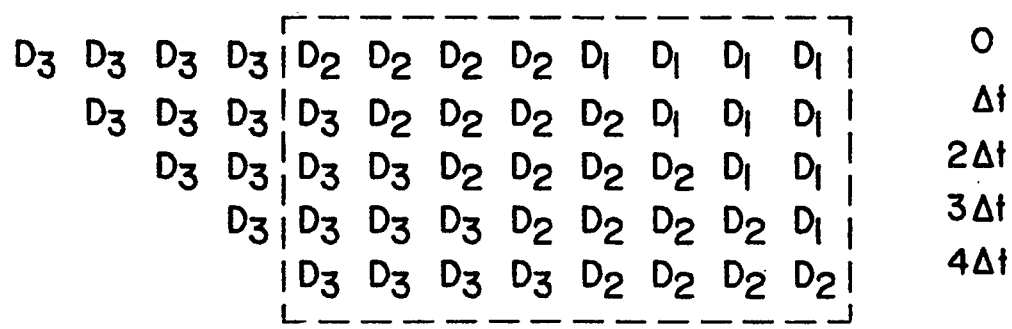

The impact of the constraining of input data is illustrated in FIG. 4 which schematically depicts the passage of input data through a digital filter when the data are not constrained, FIG. 4a, and when the data are constrained, FIG. 4b, such as by operating the output state of the filter at a speed four times faster than the input data is sampled. With reference to FIG. 4, the variable $D_N$ represents digital data input into the filter, where N references the order of arrival of the data at the filter 100. The filter 100 utilizes eight taps represented by the legend $A_0$ ... $A_7$, where $A_0$ is the tap associated with the most recently arrived data. Each line of the schematic of FIG. 4 represents the position of the data inside and outside the filter at the designated time, successive lines showing the change in position on consecutive clockings of the state of the filter. As can be seen in FIG. 4a, when the input data is clocked into the filter at the same rate as the output state is computed and the input data is not otherwise constrained, the filter has $2^N$ states, where N is the number of taps (assuming a binary data signal).

In the schematic of FIG. 4b, the input data is relatively constrained by clocking of the output state of the filter at a rate four times greater than the input is sampled. Thus, each input data signal, $D_1$, $D_2$, $D_3$ is repeated four times. Significantly, the state of the filter at any time can be calculated from knowledge of the three data signals currently in the filter and of the position sequence of the three signals within the filter. The relative constraint on the input data has reduced the number of unknowns to determine in FIG. 4a to four, three to determine the input data and one to determine the position of the input data within the filter. In terms of the number of memory locations needed to define the possible states of the filter, the unconstrained system of FIG. 4a needs $2^8$ or 256 locations whereas the relatively constrained system of FIG. 4b requires $2^3$ (combinations of three data signals) times 4 filter state values [one for each "position"] for each combination or 32 memory locations.

with further reference to FIG. 4b, the state of the filter at any time can be determined from the three (at most) signals within the filter and an indication of the position of the three signals within the filter. For example, the state of the filter of FIG. 4b may be determined by reference to $D_3$, $D_2$, and $D_1$, plus a position indicator having four cycles. In the example, filter of FIG. 4b, the four possible states of the filter during the time $\Delta t$ to $4\Delta t$ may be expressed as:

| Time | Data | Position |
|---|---|---|
| $\Delta t$ | $D_3$, $D_2$, $D_1$ | 00 |
| $2\Delta t$ | $D_3$, $D_2$, $D_1$ | 01 |
| $3\Delta t$ | $D_3$, $D_2$, $D_1$ | 10 |
| $4\Delta t$ | $D_3$, $D_2$, $D_1$ | 11 |

For example, if $D_1=0$, $D_2=1$, $D_3=0$, $D_4=1$ in the filter of FIG. 4b, the state of the filter over time from 0 to $\Delta$ may be expressed as:

| Time | Data | Position |
|---|---|---|
| 0 | 10Y | 10 |
| $\Delta t$ | 010 | 00 |
| $2\Delta t$ | 010 | 01 |
| $3\Delta t$ | 010 | 10 |
| $4\Delta t$ | 010 | 11 |
| $5\Delta t$ | 101 | 00 | where Y may be either 0 or 1, depending upon prior data.

Figure 5:
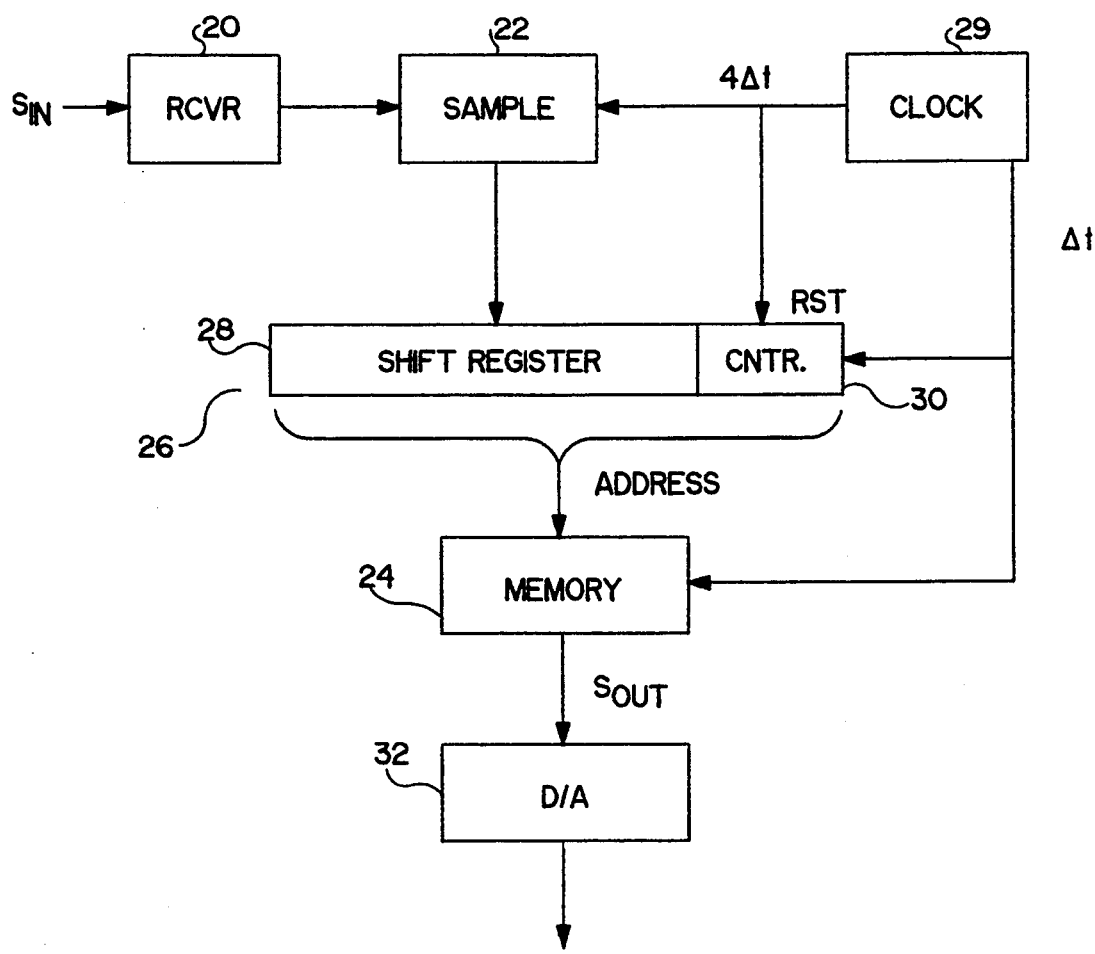
FIG. 5 is a functional block diagram illustrating an embodiment of the FIR filter of the present invention.

With reference to FIG. 5, the present invention may be incorporated into a device which uses the ability of the invention to express the state of the filter in terms of input data bits and a positional counter.

In the following, the signal is assumed to be binary, that is X=2, although the present invention is not so limited. A preferred embodiment of the present invention may include a receiver 20 for receiving an input signal $S_{IN}$, a sampling circuit 22 for sampling the received input signal at periodic intervals, a storage device 24 for a lookup table containing the states of the filter values $S_{OUT}$, and an addressing device 26 for recalling a state of the filter value $S_{OUT}$ from the storage device 24. The addressing device 26 may include a shift register 28 and a counter 30. Various of the devices may be clocked by a clock 29 which may have plural outputs to provide plural clocking rates. The output $S_{OUT}$ from the storage device may go to a digital to analog converter 32 for subsequent use.

In operation, a data signal received by the receiver 20 may be demodulated, as appropriate, and provided to the sampling circuit 22 which, through conventional means, digitizes the received signal at intervals controlled by a clocking signal from the clock 29. The digital signal from the sampling circuit 22 is provided to the shift register 28, generally as an input to the higher order bits of the shift register 28. Thus, the shift register 28 contains the data bits which may be used along with position information to determine the output state of the filter.

The position information may be provided by the counter 30 which is reset in coordination with the arrival of new input data from the sampling circuit 22. The counter 30 can be used to address the memory, with the contents of the shift register 28 addressing the set of output states associated with a particular set of input data and the contents of the counter 30 being used to increment down memory to retrieve the output state from successive memory locations upon the successive incrementing of the counter 30.

The receiver 20 may be any appropriate device known in the art. It may include an analog to digital converter if an analog signal is being received. The present invention is, however, also desirably used for conditioning digital information or waveforms generated from a digital process. Thus, the receiver 20 need not exist at all and the invention can be used in a digital signal conditioning or filtering system.

The storage device 24 may be an EPROM, RAM, Dual Port RAM or other device for storing data. The device 24 stores all of the state of the filter values needed for a particular application. The states of the filter are computed prior to using the filter using formula (1) or by other known techniques and stored using known techniques. The states of the filter may, thus, be computed immediately prior to using the filter and may be updated during the use of the filter depending upon the desired filter characteristics.

The addressing device 26 may be one known in the art that provides an interim multi-bit storage location and means for incrementing several of the bits stored therein. For example, it may be a field programmable gate array having a shift register 28 and a counter 30, such as a flip-flop or set of flip-flops. The input to the shift register 28 is a bit stream with a constraint equal to the length of a signal. The shift register 28 provides interim storage for the incoming bits that are to be used as part of the address for the storage device 24. The counter 30 provides the rest of the address by adding positional information to the incoming bits in the shift register.

The receiver 20 and sampling circuit 22 may be replaced with any conventional device which can present digital data in a time-ordered manner to the addressing registers. The relative clock rates used in the filter of FIG. 5 are illustrative only. While not required for the invention, it is convenient when the output rate of the filter is an exact multiple of the data input rate. Such a relationship can exist or be made to exist in a transmitting system. For example, PSK may be generated using an integer number of cycles per bit transition and integer number of samples per cycle, thereby assuring a reduced number of signal states at the sampling moments.

The combination of the pattern information and the positional information in the shift register 28 is used to address the memory 24 so that a particular state of the filter value $S_{OUT}$ may be elicited therefrom. The number of bits N used to address the memory 24 is the sum of the number or bits P in the data pattern and the number of bits defining the positional information.

By way of further example, the applicant has built a 95 tap filter in which the output states were computed at eight times the input rate. Such system used 13 bits of pattern data plus three bits of position information (i.e., $N=16=13+3$). The thirteen bits of pattern data were sufficient to robustly represent all of the possible combinations of input data (which was grouped in sets of 8 bits each). The eight different positions could be specified in 3 bits of position ($2^3$ equaling 8). The $2^{16}$ states of the filter may be addressed from a 64k byte ROM at a speed that allows the filter to operate at 12 MHz (faster speeds being possible with faster parts). In a comparable system of the prior art, the filter would only operate at 400 KHz.

In the preceding discussion, the input was assumed to be binary; 0 or 1. In further embodiments other size inputs could be used. For example, four bit inputs could be combined into one 16 bit address to compute a part or all of the FIR filter.

The present invention can also be cascaded with known filter techniques to achieve longer filters.

The method and device of the present invention has been described herein as having the input data constrained relative to the frequency of computation of the output state; however, input data could be constrained in other ways and still come within the scope of the invention. For example, while the input data could be sampled at a rate equal to the rate of calculation of the output state, the input data may be constrained by bandwidth or sampling techniques such that its variability is constrained relative to the speed of the system. In such case, the embodiment of the invention described above could readily be modified by those skilled in the art to utilize the present invention with respect to such constraints on the input data.

While preferred embodiments of the present invention have been described, it is to be understood that the embodiments described are illustrative only and that the scope of the invention is to be defined solely by the appended claims when accorded a full range of equivalence, many variations and modifications naturally occurring to those skilled in the art from a perusal hereof.

I claim:

1. In a method of filtering an input signal in a finite impulse response (FIR) filter having plural taps in which states of the filter are stored in a memory, the improvement comprising the steps of:
providing a time-varying input signal;

sampling the input signal at a first rate to obtain a time-varying digital signal;

addressing the memory using an address derived from the digital signal and from a position indicator signal;

extracting at a second rate as the filter output, the states stored at said addressed memory;

wherein the position indicator signal is related to the ratio of the second rate to the first rate.

2. The method of claim 1 where the input signal is binary.

3. The method of claim 1 where the input signal has plural values.

4. The method of claim 1 wherein a field programmable gate array is used to address the memory.

5. The method of claim 4 wherein a receiver provides said input signal.

6. In a finite impulse response (FIR) filter having M taps in which states of the filter are stored in a memory that can be addressed to provide an output signal, the improvement comprising:

means for receiving input signals for a FIR filter that are constrained to predetermined patterns of input data so that no more than $X^N$ of the states of the filter need be stored in the memory, where N is less than M and where X is the number of values the input signals may take; and means for addressing the states of the filter in the memory using an N bit signal that includes bits in one of the predetermined patterns and bits of positional information that describe the position of said one predetermined pattern within said input signal.

7. The FIR filter of claim 6 wherein said means for addressing comprises a field programmable gate array.

8. The FIR filter of claim 6 wherein said means for addressing comprises a shift register for providing the bits in one of the predetermined patterns and a counter for providing the bits of positional information, the bits from the shift register and the counter being combined to form an address for the memory.

9. A finite impulse response (FIR) filter receiving an input signal carrying data and having a memory for storing states of the filter, comprising:

an address device that addresses the memory with an N bit address signal comprising P bits of a pattern of the data from the input signal sampled at a first periodic rate and N-P bits of pattern position data that describe the position of the pattern of data in the input signal, N being greater than P; and a circuit that takes an output signal from the memory at a second periodic rate, wherein the number of pattern position data bits is related to the ratio between the first periodic rate and the second periodic rate.

10. The filter of claim 9 wherein said filter has M taps and N is less than M.

11. The filter of claim 9 wherein said input signal is binary.

12. The filter of claim 6 wherein said address device comprises a shift register for providing the bits of the patterns of data and a counter for providing the bits of pattern position data, the bits from the shift register and the counter being combined to form an address for the memory.

13. The filter of claim 9 wherein said address device comprises a field programmable gate array.

* * * * *